Nov. 22, 1960
L. E. SCOTT
AUTOMATIC GAIN CONTROL SYSTEM FOR
TRANSISTORIZED RECEIVERS
Filed July 13, 1959
2,961,534
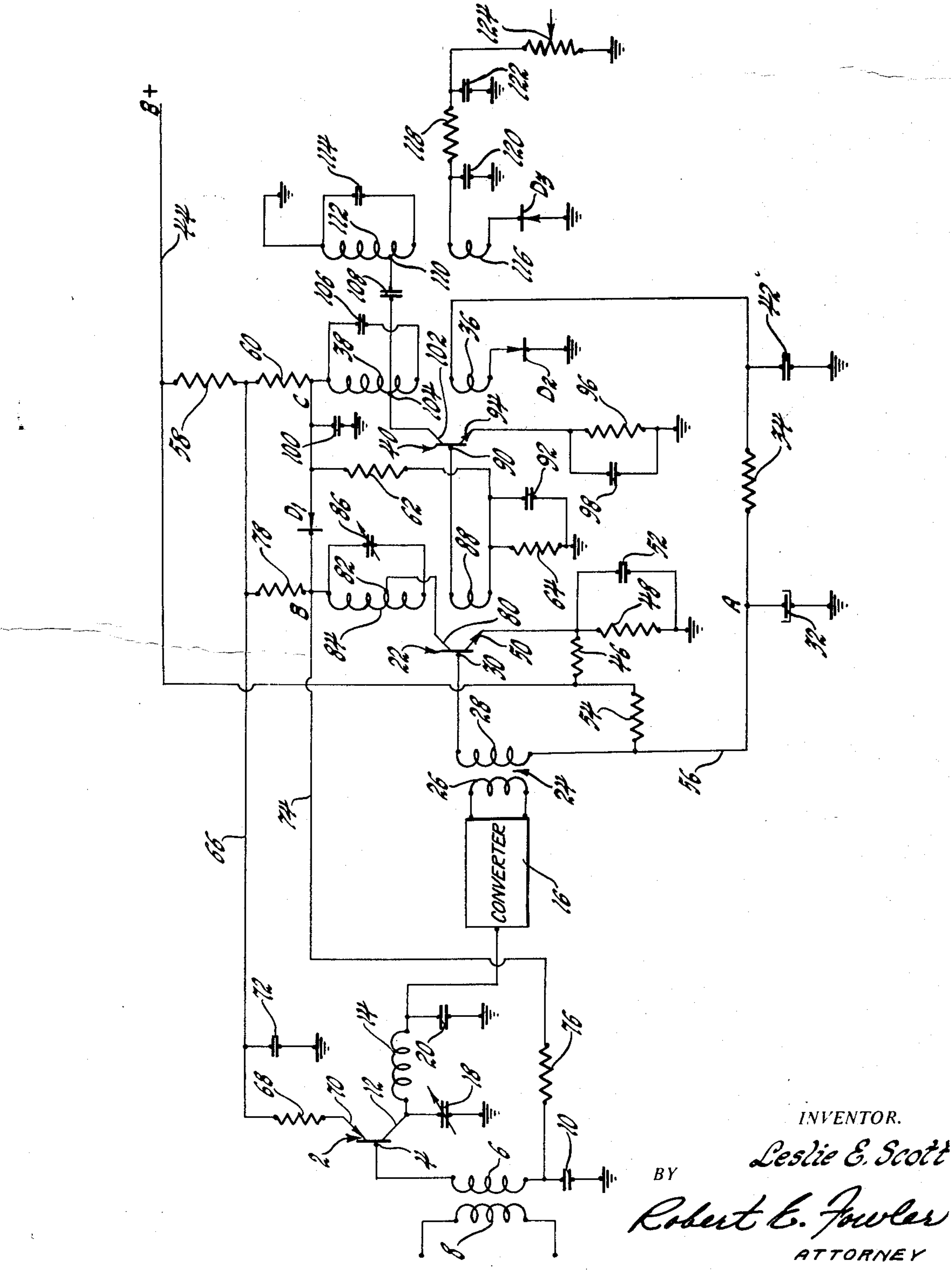
INVENTOR.
Leslie E. Scott
BY
Robert E. Fowler
ATTORNEY 2,961,534

AUTOMATIC GAIN CONTROL SYSTEM FOR TRANSISTORIZED RECEIVERS

Leslie E. Scott, Kokomo, Ind., assignor to General Motors Corporation, Detroit, Mich., a corporation of Delaware Filed July 13, 1959, Ser. No. 826,820

5 Claims. (Cl. 250—20)

This invention relates to transistorized radio receiving means and more particularly to automatic gain or volume control means for use in transistorized receiving circuits.

It is particularly necessary to incorporate automatic gain or volume control means in radio broadcast receivers designed to be used for automobiles so that the signal strength at the loud speaker will remain substantially constant. The incoming signal strength received on the car antenna as the vehicle is operated varies considerably as the vehicle changes location and if some means were not provided for automatic gain control the volume fluctuation would be quite unsatisfactory. In conventional tube receivers used in automobiles, automatic volume control means has been conventional for a long period of time. With the advent of transistors it is still necessary to continue the use of automatic volume control means. However, in order to obtain a sufficiently strong feed-back signal to properly control the gain or volume of a transistorized amplifier it has been necessary to utilize at least one amplification stage in the automatic gain control feed-back line. To date transistors are relatively expensive items and the use of an additional transistor for this purpose increases the cost.

It is, therefore, an object in making this invention to provide an efficient automatic gain control system for a transistorized receiver which does not require any additional stages of amplification.

It is a further object in making this invention to provide an efficient automatic gain control system for a transistorized receiver which utilizes a compound reflex feed-back circuit for automatic gain control.

It is a still further object in making this invention to provide a compound reflexed feed-back circuit for a transistorized amplifying system which utilizes a feed-back from both the first and second IF amplifier stages to control the RF amplifier stage.

It is a still further object in making this invention to provide a compound reflex automatic gain control system for a transistorized receiver utilizing feed-back from a plurality of IF amplifier stages to the RF amplifier stage incorporating time delay in the application of the control voltage.

With these and other objects in view which will become apparent as the specification proceeds, my invention will be best understood by reference to the following specification, claims and the illustration of the accompanying drawing in which:

The figure is a circuit diagram of the high frequency amplifying section of a transistorized radio receiver embodying the automatic gain control system of my invention.

Referring now more particularly to the drawing there is shown therein a first radio frequency amplifying stage including a transistor 2, the base electrode 4 of which is fed by signals from the input transformer secondary 6 coupled to the primary 8. The signal from the antenna is directly applied to the primary 8 and developed in the secondary 6 where it is applied directly to the base 4 of the transistor 2 for amplification. A condenser 10 is connected between the lower terminal of the secondary 6 and ground. The collector electrode 12 of the RF amplifier transistor 2 is connected through an inductance coil 14 to a mixer converter stage 16. Variable condenser 18 is connected from the collector directly to ground at one end of the inductance and condenser 20 from the other end of the inductance 14 to ground. This resonant circuit couples the output of the radio frequency stage to the converter stage 16. The output of the converter stage is applied to the input of the first IF amplifier stage which includes transistor 22 through coupling transformer 24. This transformer consists of a primary winding 26 connected directly across the output of the converter stage 16 and a secondary winding 28, one terminal of which is connected directly to the base electrode 30 of the transistor 22. The remaining terminal of the secondary winding 28 is connected through an electrolytic condenser 32 to ground and also through resistor 34 to one terminal of a transformer winding 36. The lower terminal of secondary winding 36 is connected directly through a diode $D_2$ to ground. This diode is provided to develop the automatic volume control or gain control signal and winding 36 is inductively coupled to primary winding 38 in the output circuit of the second IF amplification stage including transistor 40. A filter condenser 42 is connected between one terminal of resistor 34 and ground.

The main power supply for the amplifier is connected to line 44 and is labeled B+. Line 44 extends to one terminal of a voltage divider including resistors 46 and 48 which are connected in series between line 44 and ground, the point intermediate these two resistors being connected directly to the emitter electrode 50 of the transistor 22 and provide the proper bias thereon. A shunting condenser 52 is connected around resistance 48. Resistor 54 is connected between power line 44 and line 56 which extends from the lower terminal of secondary winding 28 to resistor 34 previously mentioned. A plurality of resistances 58, 60, 62 and 64 are connected in series between the power line 44 and ground to form a voltage divider and provide the necessary bias for certain elements to be described. The point intermediate resistors 58 and 60 is connected through line 66 and limiting resistor 68 to the emitter electrode 70 of the radio frequency transistor 2. Filtering condenser 72 is connected between line 66 and ground. Rectifier $D_1$ is connected to a point intermediate resistors 60 and 62 and through line 74 and resistance 76 to the lower end of input transformer secondary 6 in the input to the RF amplifier stage. A resistor 78 is connected across between line 66 and 74.

The output of the first IF amplifier stage is connected from the collector electrode 80 to an intermediate tap 82 on coupling transformer primary winding 84. A tuning condenser 86 is connected across the primary winding 84 to tune this winding to the proper intermediate frequency. The secondary winding 88 in inductive relation to the primary winding 84 has one terminal connected to a point intermediate the resistors 62 and 64 in the voltage divider and the other terminal connected directly to the base electrode 90 of the secondary IF stage transistor 40. A bypass condenser 92 is connected across resistance 64. The output signal from the first IF transistor 22 is, therefore, fed directly into the base of the second stage. The emitter electrode 94 of the second stage IF transistor 40 is connected to ground through biasing resistor 96 which is shunted by condenser 98. A filter condenser 100 is connected between a point intermediate resistors 60 and 62 and ground. The output signal from the second IF transistor stage is fed from collector 102 to a tap 104 on primary 38 of the output transformer for this stage, said primary being in inductive relation to the secondary 36 which, as before described, is connected in circuit with the diode $D_2$ to develop the automatic gain control voltage. A condenser 106 is connected across primary 38 to form with said inductance a resonant circuit tuned to the proper IF frequency.

The collector electrode 102 of the transistor 40 is likewise directly capacity coupled through condenser 108 to a tap 110 on a second primary winding 112. A condenser 114 connected across primary 112 forms a resonant circuit tuned to the IF frequency. One terminal of this circuit is grounded. A further secondary winding 116 in inductive relation with primary 112 has one terminal connected through a diode $D_3$ to ground and a second terminal connected through a filter circuit, consisting of a series resistance 118 and two shunting condensers 120 and 122 to ground, to a variably tapped resistance 124 for audio take off. In this circuit, therefore, there are two separate sections in the output of the last IF stage, one section for developing the signal for automatic volume control and a second and independent section for developing the audio output. While it is clear from the drawing it is desired to mention here that the RF transistor 2 is a PNP transistor while the two transistors are both NPN transistors.

In the operation of the system and assuming that the incoming signal applied to winding 8 increases in amplitude the voltage appearing at point A decreases because of increased current flow in the AGC circuit including winding 36 and diode $D_2$. This causes current through transistor 22 to decrease since it changes the bias on the base. Current flow through transistor 22 may flow from the power supply line 44 through resistances 58 and 60 and $D_1$ or through resistances 58 and 78 to the transistor. However, since the value of resistance 78 is large the major portion flows by the first defined route. Thus a decrease in current through transistor 22 also means a decrease in current through diode $D_1$. As the signal strength increases the current through transistor 22 will decrease until it reaches such a level that the voltage at point B is equal to the voltage at point C. Then current no longer flows through diode $D_1$ and the voltage at point B begins to rise. Until this point has been reached there has been very little change in the current flow through PNP RF transistor 2 since the voltage drop across resistor 60 and $D_1$ has been supplying a forward bias to transistor 2 which allows it to conduct. When the current tnrough transistor 22 is now further reduced the voltage at point B begins to rise, which in turn now reduces the current through transistor 2 and thus reduces the RF gain at this point. A reduction in the size of the incoming signal, of course, produces the opposite effect.

It is to be noted that there is a delay in cutting the RF gain and that the gain can be regulated much more closely than in previous circuits and, therefore, a better signal to noise ratio can be obtained. Further having the AGC circuit separated from the audio output circuit is more satisfactory and produces a quieter audio signal.

What is claimed is:

1. In a radio receiver having a radio frequency and an intermediate frequency amplifying section utilizing transistors, a first transistor amplifying stage in said intermediate frequency amplifying section having an input and an output circuit, said input circuit being connected to said radio frequency amplifying section, a second transistor amplifying stage in said intermediate frequency amplifying section having an input circuit connected to the output circuit of the first transistor amplifying stage and two independent output circuits, a first rectifying circuit connected to one of the output circuits of the second transistor amplifying stage for supplying a detected signal to the receiver, a second rectifying circuit connected to the other output circuit by the second transistor amplifying stage and to the input of the first transistor amplifying stage to develop a volume control signal and a connection from the output circuit of the first transistor amplifying stage to the radio frequency section to apply a control voltage back to that section to maintain constant volume from an independent output circuit after delay and amplification in the intermediate frequency section.

2. In a radio receiver having a radio frequency and an intermediate frequency amplifying section utilizing transistors, a first transistor amplifying stage in said intermediate frequency amplifying section having an input and an output circuit, said input circuit being connected to said radio frequency amplifying section, a second transistor amplifying stage in said intermediate frequency amplifying section having an input circuit connected to the output circuit of the first transistor amplifying stage and two independent output circuits, a first rectifying circuit connected to one of the output circuits of the second transistor amplifying stage for supplying a detected signal to the receiver, a second rectifying circuit connected to the other output circuit of the second transistor amplifying stage and to the input of the first transistor amplifying stage to develop a volume control signal, a source of electrical power, a plurality of conductive paths connected between the source of electrical power and the output circuit of the first transistor amplifying stage, one of said conductive paths including a rectifier to control the direction of current flow and a conductive connection between the output circuit of the first transistor amplifying stage and the radio frequency section to feed back a control voltage to regulate the volume.

3. In a radio receiver having a radio frequency and an intermediate frequency amplifying section utilizing transistors, a first transistor amplifying stage in said intermediate frequency amplifying section having an input and an output circuit, said input circuit being connected to said radio frequency amplifying section, a second transistor amplifying stage in said intermediate frequency amplifying section having an input circuit connected to the output circuit of the first transistor amplifying stage and two independent output circuits, a first rectifying circuit connected to one of the output circuits of the second transistor amplifying stage for supplying a detected signal to the receiver, a second rectifying circuit connected to the other output circuit of the second transistor amplifying stage and to the input of the first transistor amplifying stage to develop a volume control signal, a source of electrical power, a voltage divider circuit connected between the source of electrical power and ground, an intermediate point in said voltage divider circuit being connected to the input circuit of the second transistor amplifying stage, a third rectifier circuit connected from a further tap on the voltage divider circuit to the output circuit of the first transistor amplifying stage and through which current may flow that flows through the first transistor amplifying stage, and a conductive connection from the output of the first transistor amplifying stage to the radio frequency section to apply a delayed control voltage to maintain constant output.

4. In a radio receiver having a radio frequency and an intermediate frequency amplifying section utilizing transistors, a first transistor amplifying stage in said intermediate frequency amplifying section having an input and an output circuit, said input circuit being connected to said radio frequency amplifying section, a second transistor amplifying stage in said intermediate frequency amplifying section having an input circuit connected to the output circuit of the first transistor amplifying stage and two independent output circuits, a first rectifying circuit connected to one of the output circuits of the second transistor amplifying stage for supplying a detected signal to the receiver, a second rectifying circuit connected to the other output circuit of the second transistor amplifying stage and to the input circuit of the first transistor amplifying stage to develop a volume control signal, a source of electrical power, a voltage divider circuit connected between the source of electrical power and ground, an intermediate point in said voltage divider circuit being connected to the input circuit of the second transistor amplifying stage, a third rectifier circuit connected from a further tap on the voltage divider circuit to the output circuit of the first transistor amplifying stage and through which current may flow that flows through the first transistor amplifying stage, a further conductive connection from a third tap on the voltage divider circuit in shunt with a part of the voltage divider circuit and the third rectifier said further conductive connection having a higher resistance value than the part of the voltage divider which it shunts, the current through the two shunt paths determining the total current in the first transistor amplifying stage and a feed back line connecting the output circuit of the first transistor amplifying means to the radio-frequency section to feed back a D.C. control voltage to that section to maintain substantially constant output.

5. In a radio receiver having a radio frequency and an intermediate frequency amplifying section utilizing transistors, transistor means in said intermediate frequency amplifying section having an input and two independent output circuits, said input circuit being connected to said radio frequency amplifying section, a first rectifying circuit connected to one of the independent output circuits of said transistor means in said intermediate frequency amplifying section for supplying a detected signal to the receiver, a second rectifying circuit connected to the other independent output circuit for the transistor means in the intermediate frequency amplifying section and to the input of the transistor means to develop a volume control signal and apply it to the transistor means in the intermediate frequency amplifying section and a connection from one of the independent output circuits of the transistor means back to the radio frequency section to apply a control voltage to the radio frequency section to maintain constant receiver volume that has been developed from a signal appearing in an independent output circuit after delay and amplification in the intermediate frequency amplifying section.

No references cited.